United States Patent [19]

Bai et al.

[11] Patent Number: 4,581,505

[45] Date of Patent: Apr. 8, 1986

[54] IMPACT SWITCH

[75] Inventors: Monty W. Bai, Scottsdale; Alfred B. Meyer, Mesa, both of Ariz.

[73] Assignee: Motorola, Inc., Schaumburg, Ill.

[21] Appl. No.: 686,512

[22] Filed: Dec. 26, 1984

[51] Int. Cl.[4] ...................... H01H 35/14; H01L 41/08

[52] U.S. Cl. .......................... 200/61.45 R; 200/61.48; 200/61.51

[58] Field of Search ...................... 200/61.45 R-61.53, 200/83 N; 310/329, 339

[56] References Cited

U.S. PATENT DOCUMENTS 2,963,911 12/1960 Courtney-Pratt et al. ..... 310/329 X
3,097,272 7/1963 Hautly ............................ 200/61.49
3,256,762 6/1966 Haas et al. .................. 200/61.49 X
3,538,232 11/1970 Bachtig et al. ................ 310/329 X

*Primary Examiner*—J. R. Scott
*Attorney, Agent, or Firm*—Raymond J. Warren

[57] ABSTRACT

An apparatus and method is disclosed for providing an impact switch that is non-critical to rotational forces. The impact switch consists of a plate having an "X" beam disposed therein that is capable of flexing. A mass is located in the center on one side of the beam. The plate is covered by a housing having a pin extending therethrough. The cover is placed such that when the required force is exerted on the beam it will flex causing the mass and pin to come in contact thereby completing an electrical circuit. The force required to make contact can be varied by changing the weight of the mass and/or the material or dimension of the beam.

1 Claim, 4 Drawing Figures

IMPACT SWITCH

BACKGROUND OF THE INVENTION

1. Field of the Invention

This invention relates, in general, to switches and, more particularly, to beam type impact switches.

2. Description of the Background

Various types of impact switches are known in the art. These types of swithces have varied and numerous uses such as to detect an automobile impact. Among existing impact switches problems arise when utilized in a device which rotates. If the impact switch is offset from the center of that device it may result in the beam being deflected at an angle. This causes the switch to impact incorrectly or not at all.

SUMMARY OF THE INVENTION

Accordingly, it is an object of the present invention to provide an impact switch and method of operation that will overcome the deficiencies of the prior art.

A further object of the present invention is to provide an impact switch and method of operation that is interchangeable with existing impact switches.

Still another object of the present invention is to provide an impact switch and method of operation that is non-critical to rotational forces.

The above and other objects and advantages of the present invention are provided by an apparatus and method of placing a weighted element on an "X" beam which will flex when the appropriate pressure is applied but will not be deflected by rotational forces. The present invention consists of a plate having an "X" beam defined therein that is capable of flexing. A mass is located in the center on one side of the "X" beam. The plate is covered by a housing having a pin extending therethrough. The cover is placed such that when the required force is exerted on the beam it will flex causing the mass and pin to come in contact thereby completing an electrical circuit. The force required to make contact can be varied by changing the weight of the mass and/or the material or dimension of the "X" beam.

A particular embodiment of the present invention consists of an impact switch comprising: a plate having an open disposed therethrough; a flexible "X" beam having first, second, third and fourth ends, said "X" beam being disposed in the opening of said plate and said first, second, third and fourth ends being fixedly attached to said plate; and a contact point being fixedly mounted with respect to said plate so that when said flexible beam flexes said contact point will contact said flexible "X" beam.

DETAILED DESCRIPTION OF THE DRAWINGS

Figure 1:
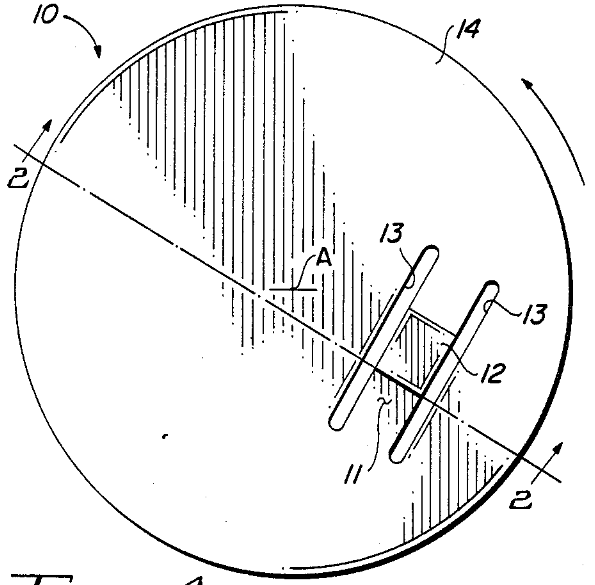
FIG. 1 is a top view of an impact switch.
Figure 2:
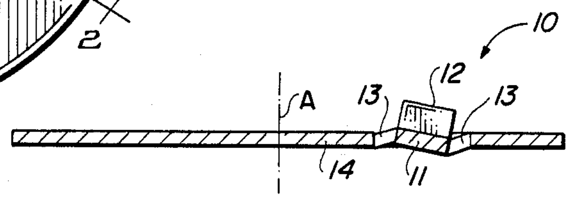
FIG. 2 is a cross-sectional view taken along line 2—2 of FIG. 1.

Referring to FIG. 1 a top view of an impact switch, generally designated 10, is illustrated. Switch 10 is a beam type switch having a beam 11 defined by a pair of parallel grooves 13 in a plate 14. Mounted on beam 11 is a mass 12. As switch 10 rotates about a center point, A, beam 11 and mass 12 may be deflected as shown in FIG. 2. FIG. 2 is a cross-sectional view taken along line 2—2 of FIG. 1. As is illustrated beam 11 is twisted by a radially extending force generated as switch 10 rotates. This can result in a permanent bending of beam 11 which would result in a misfire.

FIGS. 1 and 2 are described more thoroughly in copending application having Ser. No. 686,556 filed on the same date and assigned to Motorola, Inc.

Figure 3:
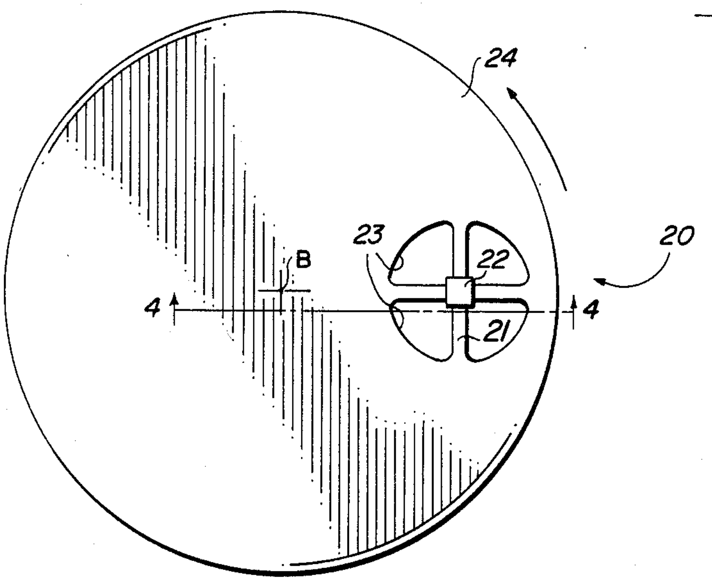
FIG. 3 is a top view of an impact switch embodying the present invention.

Referring now to FIG. 3 a top view of an impact switch generally designated 20, embodying the present invention is illustrated. Switch 20 consists of an "X" beam 21, defined by a series of openings 23 disposed in a plate 24, and a mass 22. As switch 20 rotates about a center point, B, the design of "X" beam 21 keeps itself from twisting. While "X" beam 21 prevents mass 22 from being twisted off center it does not prevent the mass from being deflected upward when the device carrying switch 20 contacts an external force. It should be noted that a piezoelectric crystal may be substituted for, or used in conjunction with, mass 22. In addition, should the weight of "X" beam 21 be sufficient, mass 22 could be eliminated. As may be seen by comparing the diagrams of FIGS. 1 and 3, the present invention may replace existing impact switches.

Figure 4:
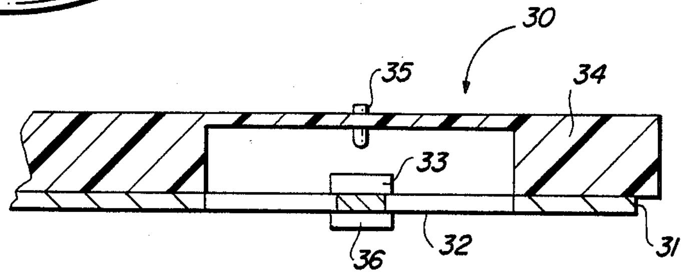
FIG. 4 is a partial cross-sectional view of an impact switch embodying the present invention.

Referring now to FIG. 4 a cross-sectional view of an impact switch, generally designated 30, embodying the present invention is illustrated. Switch 30 consists of a plate 31 having an "X" beam 32 defined therein. Mounted in the center of beam 32 is a piezoelectric crystal 33. Mounted to beam 32 opposite crystal 33 is a mass 36. Mounted above beam 32 and crystal 33 is a cover 34 having a pin 35 disposed therethrough. When the device carrying switch 30 contacts an exterior object an internal force is generated which causes beam 32 to flex bringing crystal 33 in contact with pin 35. It should be noted here that if crystal 33 is comprised of a material having sufficient weight that mass 36 may be eliminated.

Thus, it is apparent that there has been provided in accordance with the invention, an impact switch and method of operation that fully satisfies the objects, aims and advantages set forth above.

It has been shown that the present invention provides an impact switch and method of operation that is non-critical to rotational forces.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. An impact switch having an electrical input and an electrical output, said impact switch comprising:

- a conductive center plate having an opening disposed therethrough, said conductive center plate being coupled to one of said electrical input and electrical output of said impact switch;
- a conductive "X" beam having first, second, third and fourth ends, said conductive "X" beam being disposed in the opening of said conductive center plate and said first, second, third and fourth ends being fixedly attached to said conductive center plate;

a conductive mass being coupled to said conductive "X" beam;

an insulative top plate having a groove disposed therein, said insulative top plate being coupled to said conductive top plate such that the groove of said insulative top plate is disposed above the opening of said conductive center plate, said insulative top plate being coupled to the remaining one of said electrical input and electrical output of said impact device; and a conductive pin extending through said insulative top plate and into the groove of said insulative top plate such that when said conductive "X" beam flexes said conductive mass come into contact with said conductive pin.

* * * * *